United States Patent [19]

Araki

[11] Patent Number: 4,885,546

[45] Date of Patent: Dec. 5, 1989

[54] DIGITAL DEMODULATOR FOR AM OR FM

[75] Inventor: Shoji Araki, Kanagawa, Japan

[73] Assignee: Sony Corp., Tokyo, Japan

[21] Appl. No.: 305,180

[22] Filed: Feb. 2, 1989

[30] Foreign Application Priority Data

Feb. 10, 1988 [JP] Japan .................................. 63-29125
May 27, 1988 [JP] Japan ................................ 63-129933

[51] Int. Cl.$^4$ .......................... H03D 1/02; H03D 3/00
[52] U.S. Cl. ..................................... 329/341; 329/347;
358/174; 358/188; 375/80; 375/94; 375/98
[58] Field of Search ............... 329/107, 109, 126, 131,
329/132, 133, 135, 136, 178, 192, 50, 104;
455/214, 337; 375/80, 82, 94, 98, 41; 358/23,
160, 174, 188

[56] References Cited

U.S. PATENT DOCUMENTS 3,670,251  6/1972  Shintani et al. ..................... 329/109

Primary Examiner—Siegried H. Grimm
Attorney, Agent, or Firm—Alvin Sinderbrand

[57] ABSTRACT

In a demodulating circuit, for example, for demodulating an amplitude- or frequency-modulated signal, analog-to-digital converted values are obtained at a plurality of sampling points in each cycle of the modulated signal, such converted values are integrated to provide a calculated integration value for the respective cycle, and the calculated integration value is compared with a maximal integration value derived in the same manner so as to obtain the demodulated output.

16 Claims, 3 Drawing Sheets

FIG. 6
| Number of Sampling Points in One Cycle | Mean Value of Ea Relative to the Scattering of Ea in % |
|---|---|
| 5 | 4.98 % |
| 6 | 14.03 % |
| 7 | 2.53 % |
| 8 | 7.81 % |
| 9 | 1.53 % |
| 10 | 4.98 % |
| 11 | 1.02 % |
| ...... | ...... |
| 19 | 0.34 % |
| 20 | 1.24 % |
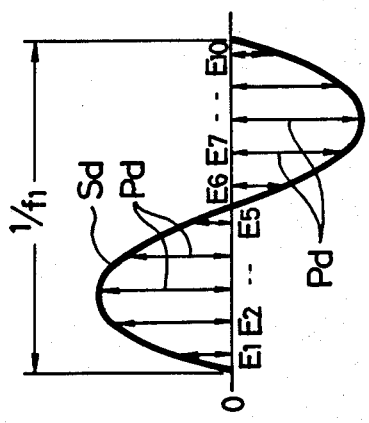
FIG. 5
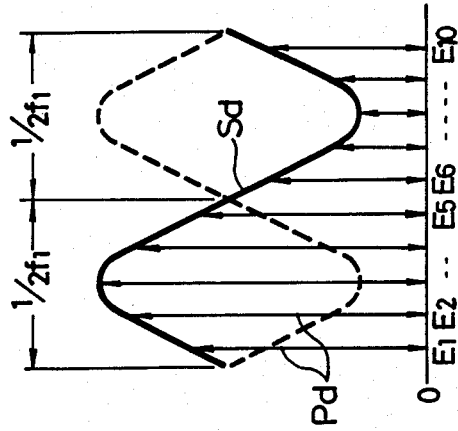
FIG. 7

DIGITAL DEMODULATOR FOR AM OR FM

BACKGROUND OF THE INVENTION

1. Field of The Invention

This invention relates generally to a circuit and method for demodulating an amplitude-modulated (AM) or frequency-modulated (FM) signal, and more particularly is directed to the demodulating of a signal in the audio band which is amplitude- or frequency-modulated with video signal data.

2. Description of the Prior Art

It is known to effect communication of an image by means of an amateur radio communication system, a personal computer communication system, a still image video telephone system and the like. At the transmission side of each such communication system, one field of a standard video signal picked up by a video camera is analog-to-digital (A/D) converted and the resulting data is written in a memory. The image data stored in the memory is read out at a relatively slow speed and digital-to-analog (D/A) converted into an AM or FM signal or the like in the audio band which is then transmitted, for example, through a telephone line or the like, to the receiver side of the system. At the receiver side, the original image data is demodulated from the received AM or FM signal, and then A/D converted and written in a memory. The image data stored in the memory at the receiver side is repeatedly read out and D/A converted to provide a video signal at a standard synchronizing frequency, and such video signal constituting a repeated field is supplied to a cathode ray tube (CRT) display for reproducing a still image thereon.

In the above described image communication system, the AM or FM signal which is transmitted and received may have any one of a variety of signal formats. For example, the transmitted and received signal may have the format of the signal $S_d$ shown in FIG. 1. More specifically, when an image transmission is to be effected from the transmission side, a level reference signal REFS is initially delivered as the signal $S_d$ for a period $T_1$ of, for example, 1 second. Such level reference signal REFS is employed for correcting the level of the signal $S_d$ as received at the receiver side of the system. In order to serve the foregoing purpose, the level reference signal REFS is desirably a signal $S_1$ having a frequency $f_1$ of 2,000 Hz and a predetermined constant level or amplitude. The period $T_1$ of the level reference signal REFS is followed by a blank or non-signal period $T_2$ of, for example, 0.2 seconds. The transmitted signal $S_d$ further includes a period $T_3$, for example, equivalent to the time required for 160 cycles of the signal $S_1$, or approximately 0.08 seconds. During each period $T_3$ following the blank period $T_2$ a start STRT signal is transmitted as the signal $S_d$. Such signal STRT is a synchronizing or marker signal indicating that image data is to be transmitted subsequent thereto. The signal STRT is, for example, a 160 cycle burst of the signal $S_1$ having a fixed level or amplitude. During a period $T_4$ following the period $T_3$ of the signal STRT, the image data corresponding to one field is transmitted, for example, a carrier signal similar to the signal $S_1$ is amplitude-modulated by the image data and the resulting AM signal $S_a$ is transmitted.

Such image data may be of 4 bits for representing the gradation or luminance of a respective pixel of one field of the video signal. As shown in FIG. 2, each cycle of the signal $S_a$ represents the image data (4 bits) for a respective pixel, and the amplitude of each cycle of the signal $S_a$ is AM-modulated in accordance with an analog value represented by the image data for the corresponding pixel. The amplitude modulation of the signal $S_1$ for providing the transmitted AM signal $S_a$ is restricted so that the amplitude of the signal $S_a$ is a minimal value greater than 0 even when the image data is "0000" which corresponds to the white level of the video signal. Since the minimal amplitude of the AM signal $S_a$ is greater than 0, the signal $S_a$ will not be interrupted during the period $T_4$ even when the AM signal $S_a$ is at its minimal amplitude and, therefore, the signal $S_1$ exists as a carry signal. On the other hand, the maximal amplitude of the AM signal $S_a$ which is obtained when the image data is "1111" is made equal to the predetermined amplitude of the level reference signal REFS.

It will be appreciated that, during the period $T_4$, the AM signal $S_a$ is transmitted for a number of cycles of the signal $S_1$ equal to the number of pixels in the video field to be transmitted. For example, in the case of a video field comprised of 160 pixels×100 pixels, the signal $S_a$ is transmitted for 16000 cycles of the signal $S_1$, whereupon the signal $S_d$ is terminated.

The described format for the signal $S_d$ allows the latter to be contained within the audio band, so that such audio band can be used for transmitting and receiving image data, for example, by means of an amateur radio communication system, a personal computer communication system, or a still image video telephone system. Furthermore, the described format of the signal $S_d$, when used to represent a video signal recorded by an electronic still camera, permits such video signal to be transmitted and received through a telephone cable. It is also possible to use an audio tape recorder for storing video images converted to the described signal format.

In general, the demodulation of an AM signal has been heretofore effected by means of an envelope detecting circuit and a synchronizing detecting circuit which are provided with a low-pass filter at a rear stage thereof for detecting the peak level of each cycle of the AM signal and for taking out the detected peak level as a demodulated output. When using the foregoing arrangement for demodulating the image data from the above described AM signal $S_a$ it is intended that the demodulated output or image data will pass through the low pass filter.

However, if the time constant of the low pass filter is too large, the peak value of each cycle of the AM signal $S_a$ is held over to the next cycle so that it is impossible to accurately take out the peak value of each cycle. In that case, since each cycle of the AM signal $S_a$ represents the luminance or gradation of a respective pixel in the reproduced image, the luminance of each pixel of the reproduced image is influenced by the luminance of the adjacent pixels in the event that the time constant of the low pass filter is selected to be large.

On the other hand, if the time constant of the low pass filter is small for avoiding the above described problem, noise included in the AM signal $S_a$ will readily pass through the low pass filter and thereby cause deterioration of the quality of the reproduced image. Further, unless the AM signal $S_a$ is maintained sufficiently below a reference level in either the envelope detecting circuit or the synchronizing detecting circuit of the known demodulation circuit, the demodulated output or image data, when being A/D converted, may exceed the dynamic range of the A/D converter used therefore. Therefore, it is necessary to effect substantially accurate automatic gain control (AGC) or level correction of the AM signal $S_a$ by means of the preceding level reference signal REFS. However, such substantially accurate AGC requires a relatively complicated and costly construction. Alternatively, the A/D converter for the demodulated output may be provided with a relatively wide dynamic range, or a longer bit length, which again increases the cost of the system.

OBJECTS AND SUMMARY OF THE INVENTION

Accordingly, it is an object of the present invention to provide for the demodulation of an AM- or FM-signal while avoiding the above-mentioned problems of the prior art.

More specifically, it is an object of this invention to effect demodulation of a signal which is, for example, amplitude modulated by image data so that each cycle of the modulated signal indicates the luminance of a respective pixel, and wherein the demodulation is effected so that, in the demodulated output, the luminance of any one pixel is not influenced by the luminance of adjacent pixels.

Another object of the invention is to effect demodulation, as aforesaid, while still permitting noise included in the modulated signal to be blocked by a suitable filter for avoiding deterioration of the image quality by such noise.

In accordance with an aspect of this invention, a demodulating circuit for demodulating an AM- or FM-signal comprises analog-to-digital converter means receiving the modulated signal for providing analog-to-digital converted values at a plurality of sampling points in each cycle of the modulated signal, means for integrating the converted values so as to provide a calculated integration value therefrom for the respective cycle, means for dividing the calculated integration value by a maximal integration value which is similarly provided, for example, by integrating converted values at a plurality of sampling points in a cycle of an earlier received level reference signal, and means for deriving a quotient of the dividing of the calculated integration value by the maximal integration value as a demodulated output corresponding to the respective cycle of the modulated signal.

In the event that the modulated signal has direct current components, the integrating of the converted values at a plurality of sampling points in a cycle of the modulated signal includes subtracting an integration value corresponding to the converted values at sampling points in a latter half-period of the cycle from an integration value corresponding to the converted values at sampling points on the former half-period of the same cycle so that the demodulated output is substantially unaffected by noise that may vary the level of direct current components of the information modulated signal.

The above, and other objects, features and advantages of this invention, will become apparent in the following detailed description of a preferred embodiment which is to be read in conjunction with the accompanying drawings, wherein the same reference numerals and letters are used to designate corresponding elements and parts in the several views.

BRIEF DESCRIPTION OF THE DRAWINGS

FIG. 5 is a diagram showing sampling points in a cycle of a modulated signal;

FIG. 6 is a table showing the relationship between the number of sampling points and the error ratio of the detected level; and FIG. 7 is a diagram showing one cycle of a modulated signal including direct current components.

DETAILED DESCRIPTION OF THE PREFERRED EMBODIMENT

Figure 2:
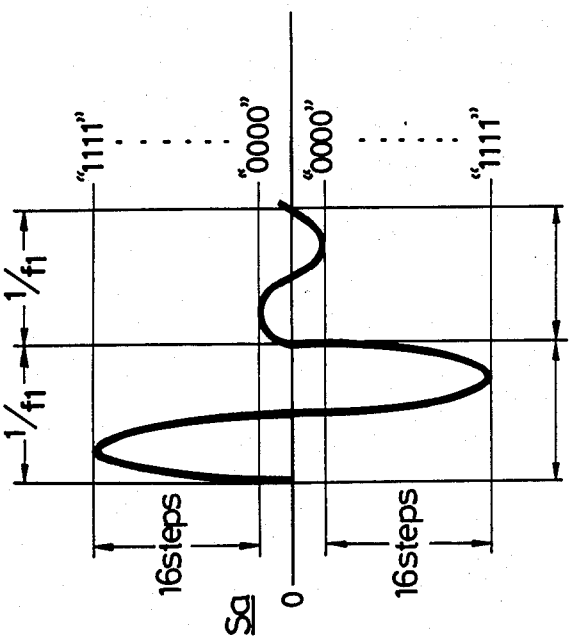
FIG. 2 is a waveform diagram of an AM signal that may be included in the format of FIG. 1.
Figure 1:
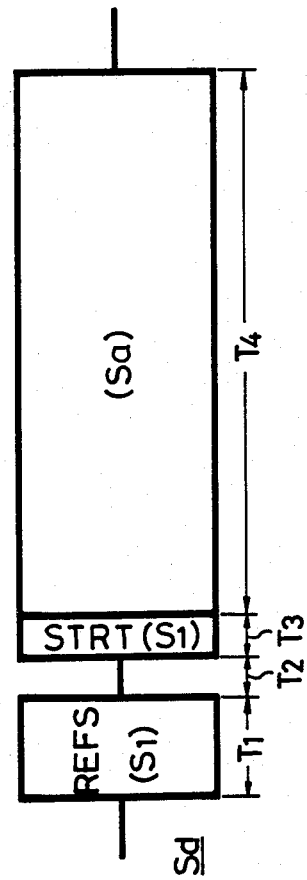
FIG. 1 is a diagram showing the format of a signal that may be demodulated in accordance with this invention.
Figure 3:
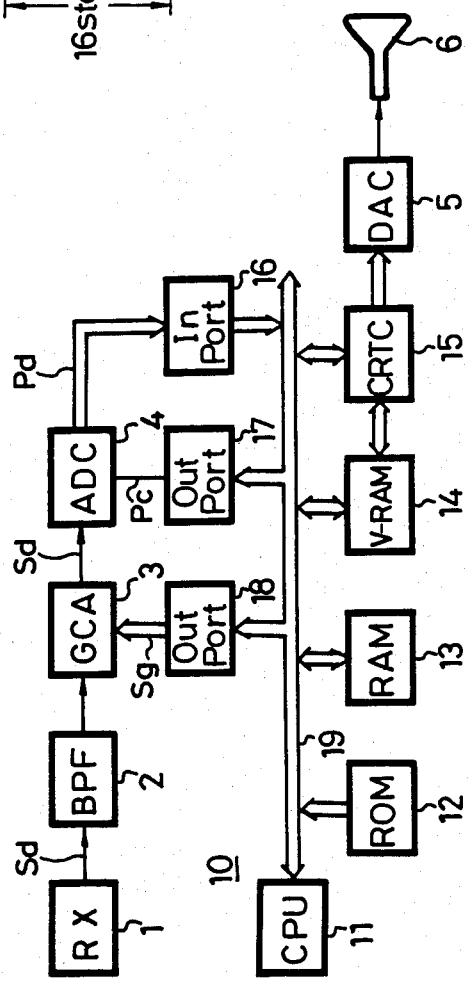
FIG. 3 is a block diagram showing a demodulating circuit according to an embodiment of the present invention in an apparatus for receiving and displaying a signal having the format of FIG. 1, and in which the AM signal is modulated with image data to be displayed.

Referring in detail to FIG. 3, it will be seen that, in an apparatus for effecting demodulation of an AM signal in accordance with an embodiment of this invention, a receiving device 1 is provided for receiving, from a suitable transmitter, a signal $S_d$ of the format described above with reference to FIGS. 1 and 2. The receiving device 1 may be constituted by the stages of a tuner circuit of an amateur radio communication system extending from a high frequency circuit to an audio detecting circuit. Alternatively, the receiving device 1 may be an audio coupler in the case of a personal computer communication system, or a receiving circuit in the case of a still image video or television telephone. In any event, the receiving device 1 supplies the signal $S_d$ through a band pass filter 2 and a gain control amplifier 3 to an analog-to-digital (A/D) converter 4. The A/D converter 4 is operative to A/D convert the AM signal $S_d$ with a bit number a few bits larger than the bit number represented by the signal $S_a$ and at a frequency substantially higher than the frequency $f_1$ of the signal $S_a$. For example, the bit number employed in the A/D converter 4 may be six, and its sampling frequency $f_2$ may be $f_1 \times 10$.

Figure 4:
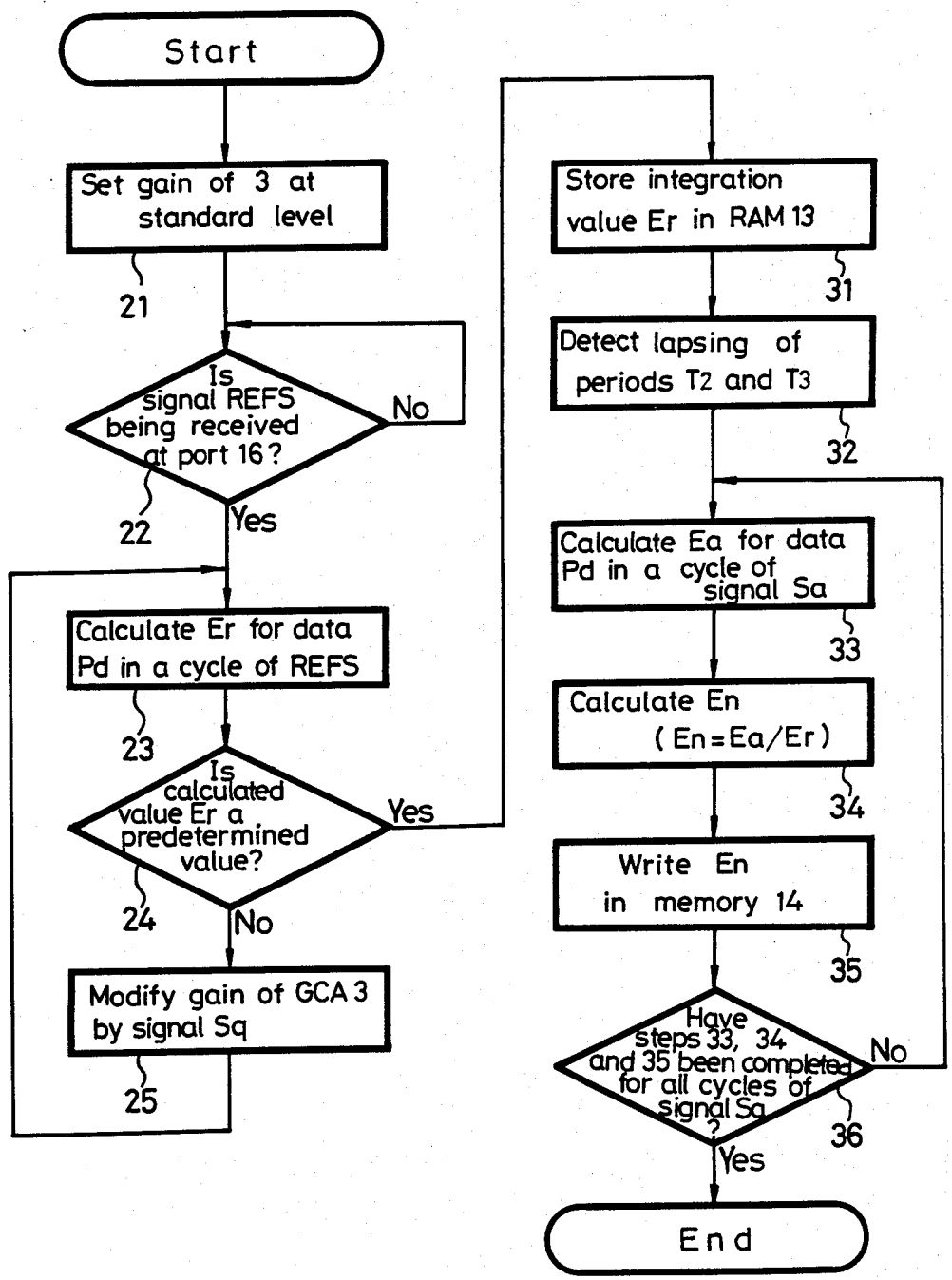
FIG. 4 is a flow chart to which reference will be made in explaining the steps involved in effecting demodulation according to the present invention.

In the embodiment of this invention illustrated in FIG. 3, demodulation is effected by a micro-computer 10 which may be constituted by a micro-computer IC HD-64180 produced by Hitachi Ltd. of Japan, and which includes a CPU 11 to which there are connected a read only memory (ROM) 12 in which there is written a routine, for example, as hereinafter described with reference to FIG. 4, a random access memory (RAM) 13 for use as a work area, a display memory (V-RAM) 14, a cathode-ray tube (CRT) controller 15, an input port 16 and output ports 17 and 18, by means of a system bus 19. The output port 18 is connected to the gain control amplifier 3 for supplying a gain control signal to the latter, for example, in the form of an 8-bit signal $S_g$. The output port 17 is connected to the A/D converter 4 for supplying a pulse $P_c$ thereto as a clock for its sampling and A/D conversion operations. Further, the converted output $P_d$ of the A/D converter 4 is supplied from the latter to the input port 16. In the case of the previously noted example, the frequency of the pulses $P_c$ and $P_d$ is $f_2$, that is, $f_1 \times 10$, and the bit number of the pulse $P_d$ is six.

The controller 15 is also shown to be connected to the display memory 14 for repeatedly reading out the image data stored in the memory 14, for example, at a rate equivalent to that of the luminance signal in the broadcast television standard. It will be appreciated that the memory 14 has a number of addresses corresponding to the number of pixels represented by the image data modulating the signal $S_a$ in the transmitted signal $S_d$, and each such address has a 4-bit length. The image data read out of the memory 14 through the controller 15 is converted to an analog luminance signal by means of a 4-bit D/A converter 5, whereupon the converted analog luminance signal is supplied to a cathode-ray tube or CRT display 6 which presents the corresponding still image.

The CPU 11 is effective to demodulate image data from the AM signal $S_a$ when the micro-computer 10 executes a routine 20 which will not be described in detail with reference to FIG. 4.

More specifically, when execution of the routine 20 is initiated or started, the gain control signal $S_g$ output from the port 18 to the amplifier 3 is set, in the step 21, to provide a standard level of the gain or amplification by the amplifier 3. In the next step 22, the output $P_d$ of the A/D converter 4 is fetched by the CPU 11 through the input port 16, and it is determined whether or not the level reference signal REFS in the signal $S_d$ is being received. The reception of the level reference signal REFS is readily determined by reason of the fact that such signal REFS has a predetermined frequency $f_1$ and a constant level. So long as the level reference signal REFS is not received, step 22 is repeated.

When the level reference signal REFS is received, the routine proceeds to step 23 in which the data $P_d$ from the converter 4, that is, the A/D converted output corresponding to the level reference signal REFS, is taken in through the input port 16, and the CPU 11 calculates an integration value $E_r$ of the converted data $P_d$ at a plurality of sampling points in one cycle of the level reference signal REFS. More specifically, since the frequency $f_2$ of the clock $P_c$ is selected to be ten times the frequency $f_1$ of the level reference signals REFS in the noted example, each cycle of the signal REFS is sampled ten times to provide ten respective data $P_d$, for example, as shown in FIG. 5. If the absolute values of the ten data $P_d$ are represented by $|E_1| - |E_{10}|$, those absolute values are added as below to derive the integration value $E_r$:

$$E_r = |E_1| + |E_2| + \ldots + |E_{10}|$$

Preferably, the value $E_r$ is calculated for each of several cycles of the level reference signal REFS and the mean value of the calculated values $E_r$ for the several cycles is derived. Thus, even if the level reference signal REFS includes an instantaneous noise, its influence on the calculated integration value $E_r$ can be ignored.

The routine then continues with step 24 wherein it is determined whether the calculated integration value $E_r$ for a cycle of the level reference signal REFS is a predetermined value. If the integration value $E_r$ is not the predetermined value, the routine proceeds to step 25 in which the gain of the amplifier is suitably modified by the gain control signal $S_g$ and the routine returns to the step 23. Thus, the steps 23, 24 and 25 are repeated until the integration $E_r$ coincides with the predetermined value therefor, or is at least within a predetermined range of tolerances with respect to such predetermined value.

When the gain of the amplifier 3 has been suitably adjusted so that the integration value $E_r$ is determined to be within the accepted range of tolerances from the predetermined value therefor in a step 24, the routine 20 proceeds from such step 24 to the step 31 wherein the integration value $E_r$ of the level reference signal REFS at such time is stored in the RAM 13.

In adjusting the gain of the amplifier 3 until the integration value $E_r$ is at a predetermined level or value, it will be apparent that the level reference signal REFS supplied to the A/D converter 4 is similarly controlled by the amplifier 3 to be at a predetermined level. Accordingly, the level of the entire signal $S_d$ including the AM signal $S_a$ received by the converter 4 is corrected to a predetermined reference level on the basis of the level reference signal REFS.

After the maximal integration value $E_r$ obtained from the converted values or data $P_d$ at sampling points in cycles of the level reference signal REFS have been stored in the RAM 13, the routine 20 proceeds to step 32 wherein the cycles of the start signal STRT are counted on the basis of the corresponding converted data $P_d$ for determining when the non-signal period $T_2$ and the start period $T_3$ have elapsed. Thereupon, in the next step 33, an integration value $E_a$ of the data $P_d$ in one cycle of the AM signal $S_a$ is calculated. Once again, and as shown in FIG. 5, the value $E_a$ is calculated by adding the absolute values $|E_1| - |E_{10}|$ of the data $P_d$ corresponding to ten sampling points in one cycle of the AM signal $S_a$. In the following step 34, a value $E_n$ is calculated by dividing the value $E_a$ calculated for the preceding step 33 by the value $E_r$ stored in the RAM 13 in step 31, that is, $E_n = E_a / E_r$. In the described embodiment, the values $E_r$ and $E_a$ are the integration values for one cycle of the level reference signal REFS and one cycle of the AM signal $S_a$, respectively. These integration values are proportional to the levels of the level reference signal REFS and the AM signal $S_a$ so that the value $E_n$ represents the ratio of the level of the level reference signal REFS to that the AM signal $S_a$. When the level of the level reference signal REFS is predetermined to be equal to a maximal available level, that is, the black level, of the AM signal $S_a$, the value or quotient $E_n$ is a normalized value of the value $E_a$. In other words, the value $E_n$ is image data derived by normalizing the gradation of a respective pixel on the basis of the black level.

In the following step 35, the value or quotient $E_n$ derived in the step 34 is written in a corresponding address of the video or display memory 14. In the next step 36, it is determined whether the steps 33, 34 and 35 have been performed for all cycles of the AM signal $S_a$, that is, whether values $E_n$ have been written in the memory 14 at the addresses thereof corresponding to all pixels of an image to be displayed. If it is determined, in step 36, that steps 33, 34 and 35 have been performed for all cycles of the AM signal $S_a$, the routine 20 is terminated or ended, and the values $E_n$ written in the memory 14, that is, the image data for one field, are repeatedly read out from the memory 14 by the controller 15 at a suitable synchronizing frequency. Such image data repeatedly read out of the memory 14 through the controller 15 is D/A converted by the converter 5 and supplied to the CRT display 6 which thereby displays a still image corresponding to the AM signal $S_a$ of the signal $S_d$ which has been transmitted.

In the event that the decision step 36 indicates that the preceding steps 33, 34 and 35 have not been performed in respect to all cycles of the AM signal $S_a$, the routine returns to the step 33 to perform the steps 33, 34 and 35 in respect to the next cycle of the AM signal $S_a$.

It will be appreciated from the foregoing that, in accordance with the present invention, image data is demodulated from the AM signal $S_a$ by A/D converting the AM signal $S_a$ at a plurality of sampling points in a cycle thereof, calculating the integration value $E_a$ of the A/D converted values for such cycle, and dividing the integration value $E_a$ by the maximal integration value $E_r$ obtained in a similar manner so that the quotient of such dividing represents a demodulated output or the original image data. Therefore, even if each cycle of the AM signal $S_a$ is made to represent the gradation or luminance of a signal respective pixel, the correct image data can be obtained from every cycle, that is, in respect to the corresponding pixel, without being influenced by the gradation or luminance of the adjacent pixels. Even if a noise is included in the AM signal $S_a$, such noise influences only the pixel corresponding to a cycle which includes the noise, and pixels corresponding to other cycles of the AM signal $S_a$ are not influenced by the noise.

Since the original image data is obtained by dividing the integration value $E_a$ for each cycle by the maximal integration value $E_r$, the bit number of A/D converter 4 can be reduced and, even if the gain of the gain control amplifier 3 is relatively coarsely set, the image data can be demodulated from the AM signal $S_a$ with sufficient accuracy. Therefore, the gain control amplifier 3 can be made relatively simple and inexpensive as it does not need to be capable of fine adjustments.

Since the steps described above with reference to FIG. 4 for effecting demodulation in accordance with this invention can be simply carried out by software associated with the micro-computer 10, the circuits of the gain control amplifier 3 and the A/D converter 4 can be relatively simplified for further reducing the cost of the demodulator embodying the invention.

In the above described embodiment of the invention, ten sampling points have been provided in each cycle of the transmitted signal $S_d$. If the number of sampling points in each cycle is increased, errors or scattering in the demodulated data can be decreased. However, if the number of sampling points in each cycle is made too large, the operating speed of the micro-computer 10 may be undesirably slowed or delayed.

The ratio, in percent, of the mean value of the integration value $E_a$ to the scattering of the integration value $E_a$ (the difference between the maximal and minimal values of $E_a$) is given in FIG. 6 for different numbers (from 5 to 20) of sampling points in each cycle. As can be seen from FIG. 6, as the number of sampling points in each cycle is increased, the error rates are decreased. The ratio of errors is particularly shown to be decreased when an odd-number, rather than an even-number, of sampling points is selected. Similar results were also obtained for signals $S_d$ having several different frequencies other than the frequency of $f_1 = 2,000$ Hz of the specifically described example. Thus, it is apparent from FIG. 6 that, if the number of sampling points in each cycle is to be decreased so as to avoid influencing the operating speed of the micro-computer, an odd number of sampling points, such as, 5 or 7, should desirably be chosen for reducing the incidence of errors in the detected levels.

When the signal $S_d$ includes direct current components, for example, as shown in FIG. 7, the integration value $E_a$ is desirably calculated by subtracting, from the integration value of the absolute values $|E_1| - |E_5|$ in the former half-cycle or period, the integration value of the absolute values $|E_6| - |E_{10}|$ in the latter half-cycle or period as follows:

$$E_a = (|E_1| + |E_2| + \ldots + |E_5|) - (|E_6| + |E_7| + \ldots + |E_{10}|).$$

In the above case, if the phase of the AM signal $S_a$ is reversed, for example, as indicated by the broken line in FIG. 7, such reversal can also be detected. Even when direct current components of the signal $S_d$ are varied due to noises included in the latter by a hum or the like, the noise components are cancelled by the above subtraction in the calculation of the value $E_a$, with the result that the eventually obtained or demodulated image data is not influenced by the noise.

In detecting the reception of the level reference signal REFS in step 22, use is made of the fact that the level reference signal REFS has a predetermined frequency and a constant level. In fact, an integration similar to that effected in the next step 23 is employed in the step 22 for detecting that the level of the level reference signal REFS is constant. Therefore, step 23 may be conveniently included in or made a continuation of step 22.

Although, in the above described embodiment of the invention, the A/D converter 4 is operated by the clock pulse $P_c$ generated by the CPU 11, such clock pulse $P_c$ may be externally generated and supplied to the converter 4 and also supplied to the CPU 11 as a signal indicating the timing of the A/D conversion effected by the converter 4. Although one cycle of the AM signal $S_a$ corresponds to one unit of the image data or information in the described embodiment of the invention, it will be appreciated that a plurality of cycles of the signal $S_a$ may be made to correspond to each unit of the image data or information.

Having described a preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A demodulating circuit for demodulating an AM- or FM- modulated signal, comprising:

analog-to-digital converter means receiving said modulated signal for providing analog-to-digital converted values at a plurality of sampling points in a cycle of said modulated signal;

means for integrating said converted values so as to provide a calculated integration value therefrom for the respective cycle;

means for dividing said calculated integration value by a maximal integration value which is similarly provided; and means for deriving a quotient of said dividing as a demodulated output corresponding to said respective cycle of the modulated signal.

2. A demodulating circuit according to claim 1; wherein, when said modulated signal has direct current components, said means for integrating said converted values subtracts as integration value corresponding to the converted values at sampling points on one half-period of said cycle from an integration value corresponding to the converted values at sampling points on the other half-period of the same cycle.

3. A demodulating circuit according to claim 2; in which said one half-period of the cycle is a latter half-period and said other half-period is a former half-period of the same cycle.

4. A demodulating circuit for demodulating an AM- or FM- modulated signal, comprising:

analog-to-digital converter means receiving said modulated signal for providing analog-to-digital converted values at a plurality of sampling points in each cycle of said modulated signal; and processor means programmed for successively integrating said converted values so as to provide a calculated integration value therefrom for the respective cycle, dividing said calculated integration value by a maximal integration value which is similarly provided, and deriving, as a demodulated output corresponding to said respective cycle of the modulated signal, a quotient of said dividing of said calculated integration value by said maximal integration value.

5. A demodulating circuit according to claim 4; wherein said processor means is further programmed so that, when said modulated signal has direct current components, said integrating includes subtracting an integration value corresponding to the converted values at sampling points on a latter half-period of said cycle from an integration value corresponding to the converted values at sampling points on the former half-period of the same cycle.

6. A demodulating circuit for demodulating an AM- or FM- modulated signal which follows a level reference signal, comprising:

Analog-to-digital converter means receiving said level reference signal and said modulated signal in succession for providing analog-to-digital converted values at a plurality of sampling points in cycles of said level reference signal and of said modulated signal, respectively;

means for integrating said converted values at said sampling points of a cycle of said level reference signal so as to provide a maximal integration value therefrom;

means for storing said maximal integration value;

means for integrating said converted values at said sampling points in each cycle of said modulated signal so as to provide a calculated integration value therefrom;

means for dividing said calculated integration value for each said cycle of the modulated signal by the stored maximal integration value; and means for deriving a quotient of said dividing as a demodulated output corresponding to the respective cycle of the modulated signal.

7. A demodulating circuit for demodulating an information bearing signal comprised of a carrier amplitude modulated with said information and which follows a level reference signal having a frequency corresponding to the frequency of said carrier and a substantially constant amplitude, comprising:

analog-to-digital converter means receiving said level reference signal and said information bearing signal in succession for providing analog-to-digital converted values at a plurality of sampling points in cycles of said level reference signal and of said information bearing signal, respectively;

means for integrating said converted values at said sampling points of cycles of said level reference signal so as to provide a reference integration value;

gain control means for variably amplifying said level reference signal and said information bearing signal, said gain control means being adjusted in response to said reference integration value to achieve a predetermined maximal value of the latter;

means for storing said maximal reference integration value;

means for integrating said converted values at said sampling points in each cycle of said information bearing signal so as to provide a calculated integration value therefrom;

means for dividing each said calculated integration value by said stored maximal reference integration value; and means for deriving a quotient of each said dividing as a demodulated output corresponding to the information modulating the respective cycle of said information bearing signal.

8. A demodulating circuit according to claim 7; in which each said cycle includes a former half-period and a latter half-period; and, in which, in said integrating, an integration value corresponding to the converted values at sampling points in said latter half-period in subtracted from an integration value corresponding to the converted values at sampling points in said former half-period of the same cycle so that the demodulated output is substantially unaffected by noise that may vary the level of direct current components of said information bearing signal.

9. A demodulating circuit for demodulating an information bearing signal comprised of a carrier amplitude modulated with said information and which follows a level reference signal having a frequency corresponding to the frequency of said carrier and a substantially constant amplitude, comprising:

gain control means for variably amplifying said level reference signal and said information bearing signal;

analog-to-digital converter means receiving said level reference signal and said information bearing signal in succession from said gain control means for providing analog-to-digital converted values at a plurality of sampling points in cycles of said level reference signal and of said information bearing signal, respectively; and processor means programmed for successively integrating said converted values at said sampling points of cycles of said level reference signal so as to provide a reference integration value, adjusting said gain control means so as to provide a maximal level of said reference integration value, storing said maximal reference integration value, integrating said converted values at said sampling points in each cycle of said information bearing signal amplified by the adjusted gain control means so as to provide a calculated integration value therefrom, dividing each said calculated integration value by said stored maximal reference integration value, and deriving a quotient of each said dividing as a demodulated output corresponding to the information modulating the respective cycle of said information bearing signal.

10. A method of demodulating an AM- or FM- modulated signal, comprising the steps of:

analog-to-digital converting said modulated signal for providing analog-to-digital converted values at a plurality of sampling points in a cycle of said modulated signal;

integrating said converted values so as to provide a calculated integration value therefrom for the respective cycle;

dividing said calculated integration value by a maximal integration value which is similarly provided; and deriving a quotient of said dividing as a demodulated output corresponding to said respective cycle of the modulated signal.

11. The method according to claim 10; wherein, when said modulated signal has direct current components, said integrating of said converted values includes subtracting an integration value corresponding to the converted values at sampling points on one half-period of said cycle from an integration value corresponding to the converted values at sampling points on the other half-period of the same cycle.

12. The method according to claim 11; in which said one half-period of the cycle is a latter half-period and said other half-period is a former half-period of the same cycle.

13. The method according to claim 10; in which there are an odd number of said sampling points in said cycle of the modulated signal.

14. A method for demodulating an information bearing signal comprised of a carrier amplitude modulated with said information and which follows a level reference signal having a frequency corresponding to the frequency of said carrier and a substantially constant amplitude, comprising:

analog-to-digital converting said level reference signal and said information bearing signal in succession for providing analog-to-digital converted values at a plurality of sampling points in cycles of said level reference signal and of said information bearing signal, respectively;

integrating said converted values at said sampling points of cycles of said level reference signal so as to provide a reference integration value;

variably amplifying said level reference signal and said information bearing signal, and adjusting said variable amplifying in response to said reference integration value for achieving a predetermined maximal value of the latter;

storing said maximal reference integration value;

integrating said converted values at said sampling points in each cycle of said information bearing signal so as to provide a calculated integration value therefrom;

dividing each said calculated integration value by said stored maximal reference integration value; and deriving a quotient of each said dividing as a demodulated output corresponding to the information modulating the respective cycle of said information bearing signal.

15. The method according to claim 14; in which each said cycle includes a former half-period and a latter half-period; and, in which said integrating includes subtracting an integration value corresponding to the converted values at sampling points in said latter half-period from an integration value corresponding to the converted values at sampling points in said former half-period of the same cycle so that the demodulated output is substantially unaffected by noise that may vary the level of direct current components of said information bearing signal.

16. The method according to claim 14; in which there are an odd number of said sampling points in each of said cycles of said level reference signal and said information bearing signal.

* * * * *